(12) United States Patent
Meusel et al.

(10) Patent No.: US 11,164,983 B2
(45) Date of Patent: Nov. 2, 2021

(54) STACKED MULTI-JUNCTION SOLAR CELL

(71) Applicant: AZUR SPACE Solar Power GmbH, Heilbronn (DE)

(72) Inventors: Matthias Meusel, Heilbronn (DE); Rosalinda Van Leest, Heilbronn (DE); Alexander Berg, Heilbronn (DE); Lilli Horst, Rosengarten (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 16/774,813

(22) Filed: Jan. 28, 2020

(65) Prior Publication Data

US 2020/0243702 A1    Jul. 30, 2020

(30) Foreign Application Priority Data

Jan. 28, 2019  (DE) .......................... 102019000588.0

(51) Int. Cl.
*H01L 31/043* (2014.01)
*H01L 31/054* (2014.01)
(Continued)

(52) U.S. Cl.
CPC ...... *H01L 31/043* (2014.12); *H01L 31/03046* (2013.01); *H01L 31/054* (2014.12); *H01L 31/0693* (2013.01); *H01L 31/06875* (2013.01)

(58) Field of Classification Search
CPC . H01L 31/0304–03048; H01L 31/0687; H01L 31/06875; H01L 31/0735; H01L 31/076; H01L 31/077
See application file for complete search history.

(56) References Cited

U.S. PATENT DOCUMENTS 6,150,603 A * 11/2000 Karam .................. H01L 31/068
                                                              136/252
2008/0163920 A1* 7/2008 Meusel ............. H01L 31/02327
                                                              136/246

(Continued)

FOREIGN PATENT DOCUMENTS

| DE | 10 2013 209 217 A1 | 11/2013 |
| EP |         2 966 692 A1 | 1/2016 |
| KR | 10-2011-081387 A | 7/2011 |

OTHER PUBLICATIONS

Jun et al., "Numerical Simulation of GaInP/AlInP Window Layer For High Concentration Photovoltaic Cells," 6th Annual Int'l AIP Conf. Proc., vol. 1277, pp. 32-35 (2010).

(Continued)

*Primary Examiner* — Eric R Smith
(74) *Attorney, Agent, or Firm* — Muncy, Geissler, Olds & Lowe, P.C.

(57) ABSTRACT

A stacked multi-junction solar cell with a first subcell having a top and a bottom, and with a second subcell. The first subcell is implemented as the topmost subcell so that incident light first strikes the top of the first subcell and after that strikes the second subcell through the bottom. A first tunnel diode is arranged between the bottom of the first subcell and the second subcell. A window layer is arranged on the top of the first subcell, and the band gap of the window layer is larger than the band gap of the first subcell. A cover layer is arranged below metal fingers and above the window layer, and an additional layer is arranged below the cover layer and above the window layer. A thickness of the additional layer is less than the thickness of the window layer.

16 Claims, 2 Drawing Sheets

(51) Int. Cl.
*H01L 31/0693* (2012.01)
*H01L 31/0687* (2012.01)
*H01L 31/0304* (2006.01)

(56) References Cited

U.S. PATENT DOCUMENTS

| | | |
|---|---|---|
| 2010/0218819 A1 | 9/2010 | Farmer et al. |
| 2012/0199188 A1* | 8/2012 | Nie ................. H01L 31/035281 136/256 |
| 2012/0247547 A1* | 10/2012 | Sasaki ............... H01L 31/06875 136/255 |
| 2012/0285526 A1* | 11/2012 | Jones-Albertus ... H01L 31/0725 136/256 |
| 2013/0081681 A1* | 4/2013 | Wu ....................... H01L 31/065 136/255 |
| 2016/0013336 A1* | 1/2016 | Sato ................. H01L 31/03046 136/244 |
| 2017/0200845 A1 | 7/2017 | King et al. |
| 2018/0062020 A1* | 3/2018 | Fafard ..................... H02S 40/44 |
| 2018/0337082 A1* | 11/2018 | Krishna ............ H01L 21/02507 |

OTHER PUBLICATIONS

Smith et al., "InAlAs Photovoltaic Cell Design for High Device Efficiency," Prog. Photovolt. Res. App., vol. 25, pp. 706-713 (Apr. 17, 2017).

* cited by examiner

STACKED MULTI-JUNCTION SOLAR CELL

This nonprovisional application claims priority under 35 U.S.C. § 119(a) to German Patent Application No. 10 2019 000 588.0, which was filed in Germany on Jan. 28, 2019, and which is herein incorporated by reference.

BACKGROUND OF THE INVENTION

Field of the Invention

The present invention relates to a stacked multi-junction solar cell

Description of the Background Art

Known from DE 10 2013 209 217 A1 is a multi-junction solar cell with multiple subcells. Arranged on the topmost subcell are a window layer and multiple metal fingers for forming a front contact and multiple antireflection layers.

A multi-junction solar cell with an InAlAs top cell, followed by a window layer, an InP etch stop layer, and an InGaAs contact layer is known from Smith, B. L. et al., "InAlAs photovoltaic cell design for high device efficiency," Progress in Photovoltaics: Research and Applications, 25, 2017, p. 706-713.

SUMMARY OF THE INVENTION

It is therefore an object of the invention to provide a device that advances the state of the art.

According to an exemplary embodiment of the invention, a stacked multi-junction solar cell is provided, with a first subcell having a top and a bottom, and with a second subcell.

The first subcell is implemented as the topmost subcell so that incident light first strikes the top of the first subcell and after that strikes the second subcell through the bottom.

Arranged between the bottom of the first subcell and the second subcell is a first tunnel diode.

With a window layer, wherein the window layer is arranged on the top of the first subcell, and the band gap of the window layer is larger than the band gap of the first subcell.

At least two metal fingers spaced apart from one another, wherein a cover layer is arranged below the metal fingers and above the window layer.

Arranged below the cover layer and above the window layer is an additional layer.

The thickness of the additional layer is less than the thickness of the window layer, and the band gap of the additional layer is smaller than the band gap of the window layer.

It is a matter of course that the surface of the first subcell is conditioned by the window layer, or in other words the surface is passivated, in order to thus reduce recombination losses at the boundary and to improve the efficiency of the multi-junction solar cell.

It should be noted that the absorption losses of the window layer are very small, or are zero to the degree possible, especially between the metal fingers, which is to say the region in which the light strikes the first subcell. For this purpose, the material of the window layer has a larger band gap, which is to say a smaller lattice constant, than the material of the first subcell.

In addition, it is desirable for the cover layer to be removed as completely as possible between the metal fingers in order to avoid additional absorption losses. On the other hand, it is also necessary to refrain from reducing the thickness of the window layer so as not to reduce the passivation of the surface of the first subcell.

The removal of the cover layer between the metal fingers can preferably be carried out by means of wet chemical etching processes.

One advantage of a full-area implementation of the additional layer between the window layer and the cover layer during manufacture of the multi-junction solar cell is that the additional layer integrally resting on the window layer between the contact fingers serves as an etch stop layer or as a sacrificial layer during wet chemical etch-back when the cover layer is etched away.

Because the additional layer has only a very low etching rate in comparison with the etching rate of the window layer and also in comparison with the etching rate of the cover layer, the etch time for removing the cover layer can be extended, and the cover layer between the metal fingers can be removed more reliably than before, and an etch attack of the window layer can be suppressed at the same time. It is a matter of course that the cover layer is completely or at least partially absent between the metal fingers in an improvement.

Because the additional layer has a very low etching rate, the additional layer can be made significantly thinner than the thickness of the window layer and, in particular, significantly thinner than the cover layer.

It is a matter of course in this context that, in order to suppress additional absorption losses, the thickness of the additional layer is made as thin as possible, and preferably only thick enough to form a reliable etch stop and protect the underlying window layer from etch attack.

In one improvement, the additional layer is absent between the metal fingers or, preferably, the thickness of the additional layer between the metal fingers is smaller than below the metal fingers. In other words, during overetching as part of removing the cover layer, the additional layer is likewise completely removed, but without attacking the window layer.

For example, the additional layer and the window layer can have the same elements, but in a different stoichiometry.

The lattice constant of the additional layer can be greater than the lattice constant of the window layer. In addition, the lattice constant of the window layer is less than the lattice constant of the first subcell.

The window layer and the additional layer can each have a compound with at least the constituents InAlP, or the window layer and the additional layer are made of InAlP.

In comparison with the window layer, the additional layer has a higher In content. Preferably, the additional layer has a lower Al concentration in comparison with the window layer. For example, the additional layer is made of $In_{68}Al_{32}P$. Preferably, the window layer is made of $In_{58}Al_{42}P$.

Investigations have demonstrated that the etching rate with the InAlP compound rises proportionally with an increasing Al content, wherein an InAlP compound with an Al content below 40% etches only very slowly with a mixture of citric acid, hydrogen peroxide, and water as compared with an Al content >50%.

The additional layer can include a compound with at least the constituents InP, or the additional layer is made of InP.

The cover layer can include a compound with at least the constituents GaAs or with at least the constituents InGaAs, or the cover layer is made of GaAs or InGaAs.

The thickness of the cover layer can be in a range between 30 nm and 1 µm, or the thickness of the cover layer is in a range between 120 nm and 700 nm, or the thickness of the cover layer is approximately 150 nm in the case of an application for concentrator applications or approximately 500 nm in the case of a space application.

It is a matter of course that the cover layer has a high electrical conductivity.

The cover layer can include a GaAs compound, or is made of a GaAs compound.

The additional layer can have a lower wet chemical etching rate in comparison with the window layer vis-à-vis an etching solution made of citric acid, hydrogen peroxide, and water. An advantage is that the reliability in manufacturing the multi-junction solar cell is improved by the wet chemical selectivity.

The additional layer can have an etching rate that is smaller by a factor of 5 or by a factor of 10 or by a factor of 100 in comparison with the window layer.

The additional layer can have a thickness in a range between 0.1 nm and 5 nm or in a range between 0.5 nm and 1.2 nm. Preferably, the thickness of the additional layer is exactly 0.7 nm.

The window layer can have a thickness in a range between 10 nm and 25 nm or the thickness of the window layer is in a range between 14 nm and 20 nm or the thickness of the window layer is in a range between 15 nm and 17 nm or the thickness of the window layer is 15 nm.

The cover layer and the window layer and the additional layer can have an n-doping with the dopants Si and/or Te, wherein the concentration of the dopants is greater than $5 \cdot E17$ N/cm$^3$ and less than $5 \cdot E19$ N/cm$^3$.

It should be noted that either the present multi-junction solar cell has exclusively subcells made of a III-V material and/or the bottommost subcell is implemented as a Ge subcell. Moreover, it should be noted that the multi-junction solar cell is monolithic in design, wherein the individual subcells are lattice-matched to one another, and also has one or more semiconductor bonds.

The multi-junction solar cell can have a metamorphic buffer between a bottommost subcell, having the smallest band spacing, and an immediately subsequent subcell. It is a matter of course that the immediately subsequent subcell has a larger band spacing than the bottommost subcell.

The multi-junction solar cell can be implemented in a form that is grown upright as a so-called UMM multi-junction solar cell, as well as in the form of a multi-junction solar cell that is grown inverted, which is to say as an IMM multi-junction solar cell.

The first subcell can include a compound with at least the constituents InP or the constituents InGaP or the constituents AlGaInP, or the first subcell is made of InP or of InAlP or of InGaP or of AlGaInP.

It should be noted that the aforementioned compounds in the first subcell are implemented in each case as part of the emitter or part of the base or for both the emitter and the base.

The multi-junction solar cell can include a third subcell and a fourth subcell, wherein an additional tunnel diode is always formed between two consecutive subcells in each case. Preferably, the multi-junction solar cell has exactly four subcells.

In particular, in the quadruple junction solar cell, the first subcell is implemented as an AlInGaP subcell, the second subcell as an AlInGaAs subcell, the third subcell as an InGaAs subcell, and the fourth subcell as a Ge subcell.

The multi-junction solar cell can include a third subcell, a fourth subcell, and a fifth subcell. Preferably, the multi-junction solar cell has exactly five subcells.

In particular, the first subcell is implemented as an AlInGaP subcell, the second subcell as an InGaP subcell, the third subcell as an AlInGaAs subcell, the fourth subcell as an InGaAs subcell, and the fifth subcell as a Ge subcell.

It is a matter of course that one tunnel diode is formed between two consecutive subcells in each case.

The multi-junction solar cell can be implemented as an upright monolithic multi-junction solar cell.

A semiconductor mirror can be formed between two subcells in the multi-junction solar cell. One advantage of the incorporation of the semiconductor mirror is that the radiation hardness increases in an application in aerospace, and as a result the final efficiency (EOL) increases. Preferably, the semiconductor mirror is incorporated below an InGaAs subcell and above a Ge subcell.

A metamorphic buffer can be formed between two directly consecutive subcells in the multi-junction solar cell. It is a matter of course that the metamorphic buffer and the semiconductor mirror can be incorporated at the same time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
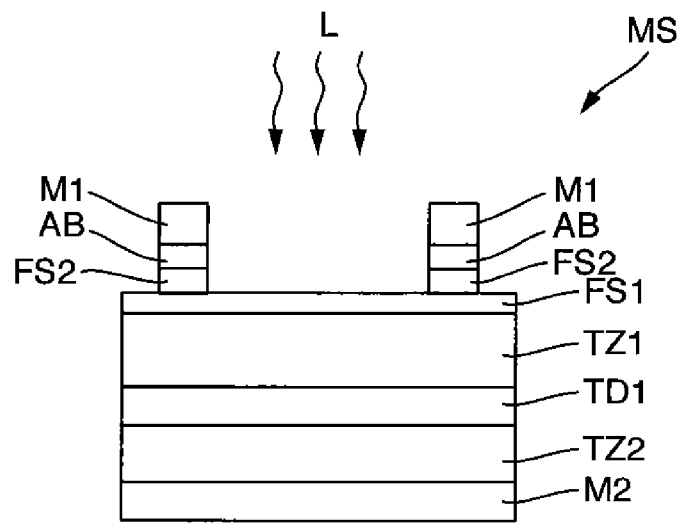
FIG. 1 is a cross-sectional view of an exemplary embodiment according to the invention of a multi-junction solar cell.

The illustration in FIG. 1 shows a view of a first embodiment, having a multi-junction solar cell MS with a first subcell TZ1 and a second subcell TZ2, wherein the first subcell TZ1 is implemented as the topmost subcell. The first subcell TZ1 has a top and a bottom.

Incident light L first strikes the top of the first subcell TZ1 and after that emerges at the bottom and strikes the second subcell TZ2.

Arranged between the bottom of the first subcell TZ1 and the second subcell TZ2 is a first tunnel diode TD. Below the second subcell TZ2, a metal layer M2 is integrally bonded over the full area to a bottom of the second subcell TZ2.

Arranged on the top of the first subcell TZ1 is a window layer FS1. Arranged above the window layer FS1 are two metal fingers M1 that are spaced apart from one another.

Below the metal fingers M1, an additional layer FS2 is formed on the window layer FS1. The additional layer FS2 has a different stoichiometry from the window layer FS1.

Arranged above the second window layer FS2, but below the metal fingers M1, is a cover layer AB.

In another embodiment that is not shown, at least a slight thickness of the second window layer FS2 is formed on the first window layer FS1 between the metal fingers M1, wherein the thickness of the additional layer FS2 between the metal fingers M1 is less than the thickness of the additional layer FS2 below the metal fingers M1.

Figure 2:
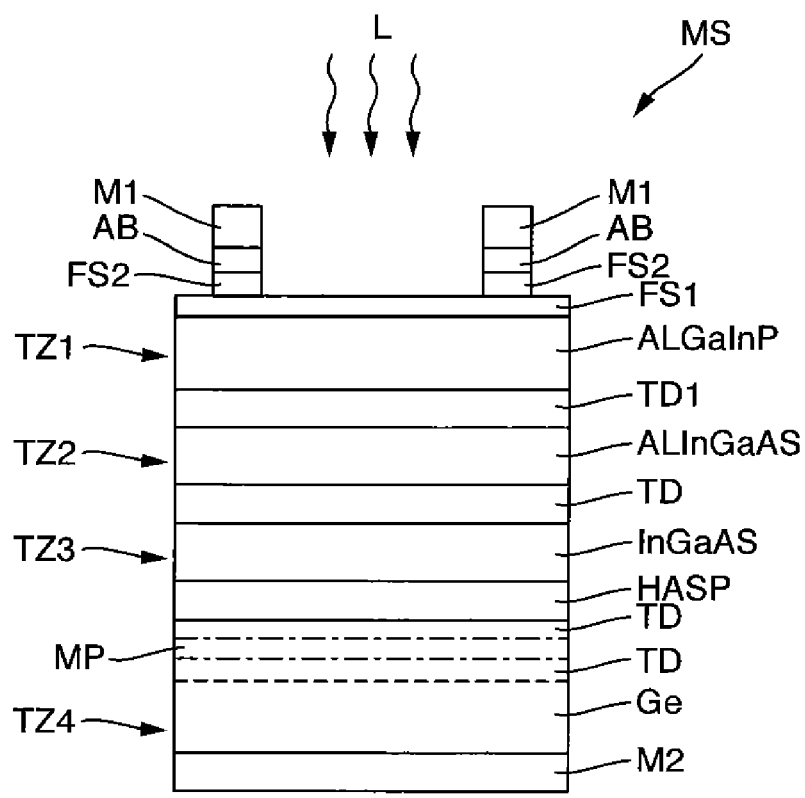
FIG. 2 is a cross-sectional view of an exemplary embodiment according to the invention of a multi-junction solar cell.

In the illustration in FIG. 2, a cross-sectional view of a second embodiment according to the invention of a multi-junction solar cell MS is shown. Only the differences from the illustration in FIG. 1 are explained below.

The first subcell TZ1 includes or is made of AlInGaP. The second subcell TZ2 includes or is made of AlInGaAs. Arranged below the second subcell TZ2 is a third subcell TZ3. The third subcell TZ3 includes or is made of InGaAs. Arranged between the second subcell TZ2 and the third subcell TZ3 is an additional tunnel diode TD.

Arranged below the third subcell TZ3 is a fourth subcell TZ4. The fourth subcell TZ4 includes or is made of Ge. Arranged between the third subcell TZ3 and the fourth subcell TZ4 is an additional tunnel diode TD.

Optionally, a semiconductor mirror HASP is arranged between the additional tunnel diode TD and the third subcell TZ3 in order to increase the radiation hardness for space applications. It is a matter of course here that the semiconductor mirror HASP is omitted for terrestrial applications.

In another embodiment, a metamorphic buffer MP is arranged between the third subcell TZ3 and the fourth subcell TZ4, wherein the additional tunnel diode TD is either arranged between the metamorphic buffer MP and the third subcell TZ3 or between the metamorphic buffer MP and the fourth subcell TZ4.

Instead of the arrangement of the metal layer M2 below the second subcell TZ2, the metal layer M2 is arranged below the fourth subcell TZ4, and is integrally bonded over the full area to a bottom of the fourth subcell TZ4.

Figure 3:
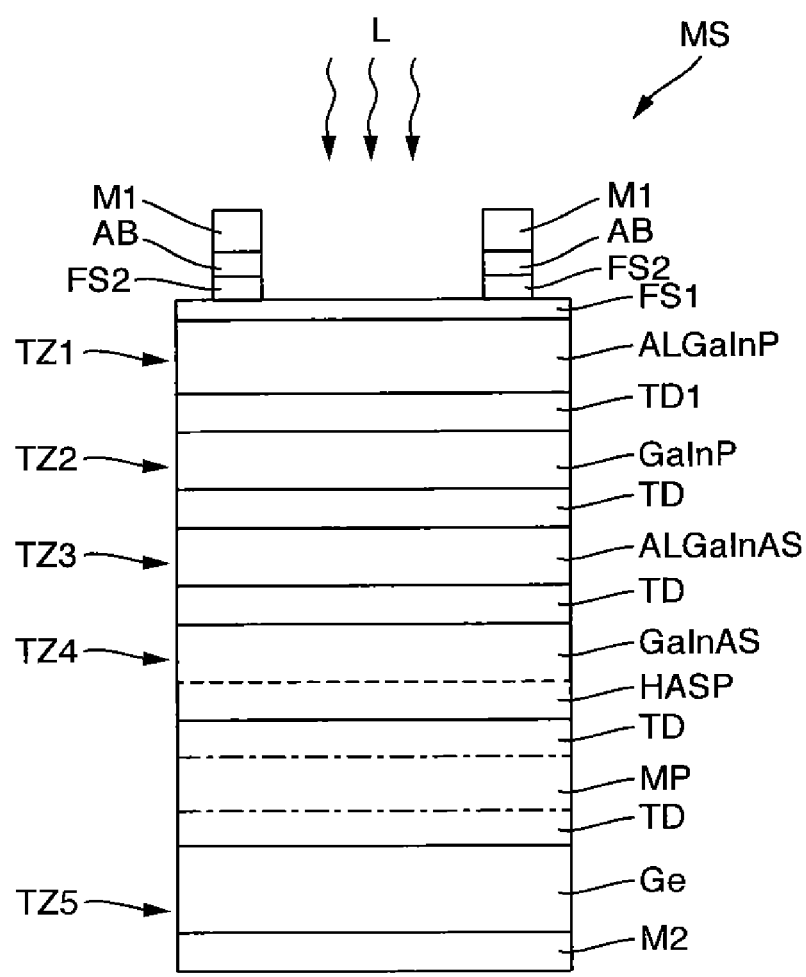
FIG. 3 is a cross-sectional view of an exemplary embodiment according to the invention of a multi-junction solar cell.

In the illustration in FIG. 3, a cross-sectional view of a third embodiment according to the invention of a multi-junction solar cell MS is shown. Only the differences from the illustration in FIG. 2 are explained below.

The first subcell TZ1 includes or is made of AlInGaP. The second subcell TZ2 includes or is made of GaInP. The third subcell TZ3 includes or is made of AlInGaAs.

The fourth subcell TZ4 includes or is made of InGaAs. Arranged below the fourth subcell TZ4 is a fifth subcell TZ5. The fifth subcell TZ5 includes or is made of Ge.

Arranged between the fourth subcell TZ4 and the fifth subcell TZ5 is an additional tunnel diode TD.

Optionally, a semiconductor mirror HASP is arranged between the additional tunnel diode TD and the fourth subcell TZ4 in order to increase the radiation hardness for space applications.

In another embodiment, a metamorphic buffer MP is arranged between the fourth subcell TZ4 and the fifth subcell TZ5, wherein the additional tunnel diode TD is either arranged between the metamorphic buffer MP and the fourth subcell TZ4 or between the metamorphic buffer MP and the fifth subcell TZ5.

The metal layer M2 is arranged below the fifth subcell TZ5, and is integrally bonded over the full area to a bottom of the fifth subcell TZ5.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell comprising:
a first subcell having a top and a bottom;
a second subcell, the first subcell being implemented as the topmost subcell so that incident light first strikes the top of the first subcell and after that strikes the second subcell through the bottom of the first subcell;
a first tunnel diode arranged between the bottom of the first subcell and the second subcell;
a window layer arranged on the top of the first subcell, a band gap of the window layer being larger than a band gap of the first subcell;
at least two metal fingers spaced apart from one another;
a cover layer arranged below the at least two metal fingers and above the window layer; and
an additional layer arranged below the cover layer and above the window layer,
wherein a thickness of the additional layer is less than a thickness of the window layer,
wherein the band gap of the additional layer is smaller than a band gap of the window layer,
wherein the window layer and the additional layer have substantially the same elements,
wherein the thickness of the additional layer between the metal fingers is smaller than below the metal fingers,
wherein the window layer and the additional layer include a compound with at least the constituents InAlP or are made of InAlP, and
wherein the additional layer has a higher In concentration and a lower Al concentration in comparison with the window layer.

2. The stacked multi-junction solar cell according to claim 1, wherein a lattice constant of the additional layer is greater than a lattice constant of the window layer, and wherein the lattice constant of the window layer is less than a lattice constant of the first subcell.

3. The stacked multi-junction solar cell according to claim 1, wherein the cover layer is completely absent or at least partially absent between the metal fingers.

4. The stacked multi-junction solar cell according to claim 1, wherein the cover layer is made of GaAs or InGaAs.

5. The stacked multi-junction solar cell according to claim 1, wherein the thickness of the cover layer is in a range between 30 nm and 1 μm, or the thickness of the cover layer is in a range between 250 nm and 500 nm, or the thickness of the cover layer is 300 nm.

6. The stacked multi-junction solar cell according to claim 1, wherein the additional layer has a lower wet chemical etching rate in comparison with the window layer vis-à-vis an etching solution made of citric acid, hydrogen peroxide, and water.

7. The stacked multi-junction solar cell according to claim 1, wherein the additional layer has a thickness, and the thickness of the additional layer is in a range between 0.1 nm and 5 nm, or the thickness of the additional layer is in a range between 0.5 nm and 1.2 nm, or the thickness of the additional layer is exactly 0.7 nm.

8. The stacked multi-junction solar cell according to claim 1, wherein the window layer has a thickness, and the thickness of the window layer is in a range between 10 nm and 25 nm, or the thickness of the window layer is in a range between 14 nm and 20 nm, or the thickness of the window layer is in a range between 15 nm and 17 nm, or the thickness of the window layer is 15 nm.

9. The stacked multi-junction solar cell according to claim 1, wherein the first subcell has a compound of the constituents InP or of the constituents InGaP, or the first subcell is made of InP or of InAlP or of InGaP or of AlGaInP.

10. The stacked multi-junction solar cell according to claim 1, wherein the cover layer and the window layer and the additional layer have an n-doping with the dopants Si and/or Te, and the concentration of the dopants is greater than $5 \cdot E17$ N/cm$^3$ and less than $5 \cdot E19$ N/cm$^3$.

11. The stacked multi-junction solar cell according to claim 1, wherein the multi-junction solar cell has a third subcell and a fourth subcell, or has exactly four subcells, and wherein an additional tunnel diode is formed between the third and fourth subcells.

12. The stacked multi-junction solar cell according to claim 1, wherein the multi-junction solar cell includes five subcells or the multi-junction solar cell consists of exactly five subcells, and wherein an additional tunnel diode is formed between each two consecutive subcells of the five subcells.

13. The stacked multi-junction solar cell according to claim 1, wherein the multi-junction solar cell is a monolithic multi-junction solar cell.

14. The stacked multi-junction solar cell according to claim 1, wherein the multi-junction solar cell has a semiconductor mirror formed between two subcells.

15. The stacked multi-junction solar cell according to claim 1, wherein the multi-junction solar cell has a metamorphic buffer between the first and second subcells.

16. A stacked multi-junction solar cell comprising:
a first subcell having a top and a bottom;
a second subcell, the first subcell being implemented as the topmost subcell so that incident light first strikes the top of the first subcell and after that strikes the second subcell through the bottom of the first subcell;
a first tunnel diode arranged between the bottom of the first subcell and the second subcell;
a window layer arranged on the top of the first subcell, a band gap of the window layer being larger than a band gap of the first subcell;
at least two metal fingers spaced apart from one another;
a cover layer arranged below the at least two metal fingers and above the window layer; and
an additional layer arranged below the cover layer and above the window layer,
wherein a thickness of the additional layer is less than a thickness of the window layer,
wherein the band gap of the additional layer is smaller than a band gap of the window layer,
wherein the thickness of the additional layer between the metal fingers is smaller than below the metal fingers,
wherein a lattice constant of the additional layer is greater than a lattice constant of the window layer, and
wherein the additional layer and the window layer comprise In, the In content in the additional layer being greater than the In content in the window layer.

* * * * *